(12) United States Patent
Kim et al.

(10) Patent No.: US 8,089,145 B1
(45) Date of Patent: Jan. 3, 2012

(54) SEMICONDUCTOR DEVICE INCLUDING INCREASED CAPACITY LEADFRAME

(75) Inventors: Gwang Ho Kim, Namyangju-si (KR); Jin Seong Kim, Mapo-gu (KR); Dong Joo Park, Gangseo-gu (KR); Dae Byoung Kang, Hwaseong-si (KR)

(73) Assignee: Amkor Technology, Inc., Chandler, AZ (US)

( * ) Notice: Subject to any disclaimer, the term of this patent is extended or adjusted under 35 U.S.C. 154(b) by 475 days.

(21) Appl. No.: 12/272,606

(22) Filed: Nov. 17, 2008

(51) Int. Cl.
| H01L 23/48 | (2006.01) |
| H01L 23/52 | (2006.01) |
| H01L 23/495 | (2006.01) |
| H01L 23/02 | (2006.01) |
| H01L 29/40 | (2006.01) |
| H01L 23/28 | (2006.01) |

(52) U.S. Cl. ........ 257/690; 257/666; 257/676; 257/678; 257/696; 257/737; 257/738; 257/787; 257/E23.01; 257/E23.011; 257/E23.037; 257/E23.069

(58) Field of Classification Search .................. 257/666, 257/678, 690, 738, 787, E23.01, E23.011, 257/E23.037, E23.069, 676, 696, 737
See application file for complete search history.

(56) References Cited

U.S. PATENT DOCUMENTS

| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Ida M Soward
(74) *Attorney, Agent, or Firm* — Stetina Brunda Garred & Brucker

(57) ABSTRACT

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads are provided in two concentric rows or rings which at least partially circumvent the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body.

20 Claims, 17 Drawing Sheets

U.S. PATENT DOCUMENTS

| | | | |
|---|---|---|---|
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Sclesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasaranthi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,767,566 A | 6/1998 | Suda | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davies et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,511 A | 12/1998 | Shin et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,973,935 A | 10/1999 | Schoenfeld et al. | |
| 5,977,630 A | 11/1999 | Woodworth et al. | |
| RE36,773 E | 7/2000 | Nomi et al. | |
| 6,107,679 A | 8/2000 | Noguchi | |
| 6,143,981 A | 11/2000 | Glenn | |
| 6,150,709 A | 11/2000 | Shin et al. | |
| 6,157,074 A | 12/2000 | Lee | |
| 6,166,430 A | 12/2000 | Yamaguchi | |
| 6,169,329 B1 | 1/2001 | Farnworth et al. | |

| | | |
|---|---|---|
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Oloffson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,770,961 B2 * | 8/2004 | Lee ................ 257/687 |
| 6,800,936 B2 | 10/2004 | Kosemura et al. |
| 6,812,552 B2 | 11/2004 | Islam et al. |
| 6,818,973 B1 | 11/2004 | Foster |
| 6,858,919 B2 | 2/2005 | Seo et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,927,478 B2 | 8/2005 | Paek |
| 6,967,125 B2 | 11/2005 | Fee et al. |
| 6,984,880 B2 * | 1/2006 | Minamio et al. ........ 257/676 |
| 6,995,459 B2 * | 2/2006 | Lee et al. ............. 257/676 |
| 6,995,460 B1 * | 2/2006 | McLellan et al. ....... 257/676 |
| 7,002,805 B2 | 2/2006 | Lee et al. |
| 7,005,327 B2 | 2/2006 | Kung et al. |
| 7,015,571 B2 | 3/2006 | Chang et al. |
| 7,045,396 B2 | 5/2006 | Crowley et al. |
| 7,053,469 B2 | 5/2006 | Koh et al. |
| 7,075,816 B2 | 7/2006 | Fee et al. |
| 7,102,209 B1 | 9/2006 | Bayan et al. |
| 7,109,572 B2 | 9/2006 | Fee et al. |
| 7,185,426 B1 | 3/2007 | Hiner et al. |
| 7,193,298 B2 | 3/2007 | Hong et al. |
| 7,211,471 B1 * | 5/2007 | Foster ................. 438/123 |
| 7,245,007 B1 | 7/2007 | Foster |
| 7,253,503 B1 | 8/2007 | Fusaro et al. |
| 7,482,690 B1 * | 1/2009 | Fan et al. ............. 257/724 |
| 7,683,461 B2 * | 3/2010 | Lau ................... 257/666 |
| 7,786,557 B2 * | 8/2010 | Hsieh et al. ........... 257/666 |
| 7,790,500 B2 * | 9/2010 | Ramos et al. ......... 438/106 |
| 7,808,084 B1 * | 10/2010 | Lee et al. ............. 257/666 |
| 7,879,653 B2 * | 2/2011 | Lin .................... 438/123 |
| 2001/0008305 A1 * | 7/2001 | McLellan et al. ....... 257/692 |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |

| | | | |
|---|---|---|---|
| 2002/0140068 A1 | 10/2002 | Lee et al. | |
| 2002/0140081 A1 | 10/2002 | Chou et al. | |
| 2002/0158318 A1 | 10/2002 | Chen | |
| 2002/0163015 A1 | 11/2002 | Lee et al. | |
| 2002/0167060 A1 | 11/2002 | Buijsman et al. | |
| 2003/0006055 A1 | 1/2003 | Chien-Hung et al. | |
| 2003/0030131 A1 | 2/2003 | Lee et al. | |
| 2003/0059644 A1 | 3/2003 | Datta et al. | |
| 2003/0064548 A1 | 4/2003 | Isaak | |
| 2003/0073265 A1 | 4/2003 | Hu et al. | |
| 2003/0102537 A1 | 6/2003 | McLellan et al. | |
| 2003/0164554 A1* | 9/2003 | Fee et al. | 257/787 |
| 2003/0168719 A1 | 9/2003 | Cheng et al. | |
| 2003/0197199 A1* | 10/2003 | Sakamoto et al. | 257/200 |
| 2003/0198032 A1 | 10/2003 | Collander et al. | |
| 2004/0027788 A1 | 2/2004 | Chiu et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0080025 A1 | 4/2004 | Kasahara et al. | |
| 2004/0089926 A1 | 5/2004 | Hsu et al. | |
| 2004/0097016 A1 | 5/2004 | Yee et al. | |
| 2004/0164387 A1 | 8/2004 | Ikenaga et al. | |
| 2004/0253803 A1 | 12/2004 | Tomono et al. | |
| 2005/0199987 A1 | 9/2005 | Danno et al. | |
| 2006/0055009 A1* | 3/2006 | Shim et al. | 257/666 |
| 2006/0087020 A1 | 4/2006 | Hirano et al. | |
| 2006/0157843 A1 | 7/2006 | Hwang | |
| 2006/0231939 A1 | 10/2006 | Kawabata et al. | |
| 2007/0023202 A1 | 2/2007 | Shibata | |
| 2008/0061414 A1* | 3/2008 | Retuta et al. | 257/676 |
| 2008/0079127 A1* | 4/2008 | Gerber | 257/676 |
| 2008/0230887 A1 | 9/2008 | Sun et al. | |
| 2009/0194854 A1* | 8/2009 | Tan et al. | 257/666 |
| 2009/0194858 A1* | 8/2009 | Youn et al. | 257/676 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | EP0936671 | 8/1999 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR DEVICE INCLUDING INCREASED CAPACITY LEADFRAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity QFP semiconductor package which includes exposed leads and an exposed die pad on the bottom surface of the package body thereof, and additional leads which protrude from side surfaces of the package body.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

Leadframes for semiconductor packages can be largely classified into copper-based leadframes (copper/iron/phosphorous; 99.8/0.01/0.025), copper alloy-based leadframes (copper/chromium/tin/zinc; 99.0/0.25/0.22), alloy 42-based leadframes (iron/nickel; 58.0/42.0), etc. according to the composition of the elements or materials included in the leadframe. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity, coupled with reduced size. Typical size restrictions for QFP packages fall within the range of about 1×1 mm to about 10×10 mm. One of the size deficiencies of currently known QFP packages is attributable to the length at which the leads protrude from the sides of the package body, such protrusion length resulting in an increase in the overall size of the QFP package and further limiting the number of inputs/outputs (I/O's) which may be included therein. With recent trends toward high integration and high performance semiconductor dies, there is a need for QFP packages to have a larger number of I/O's with excellent thermal and electrical properties. In view of this need, conventional leadframe structures as currently known and integrated into existing QFP packages often prove to be unsatisfactory.

In an attempt to address some of the deficiencies highlighted above in relation to QFP packages, there has been developed in the prior art ball grid array (BGA) and pin grid array (PGA) semiconductor packages or devices which employ the use of laminate, tape, or film circuit boards as opposed to leadframes. These particular types of semiconductor packages provide a relatively large number of I/O's, such I/O's being defined by solder balls or metal pins which are formed on a lower surface of the encapsulant or package body of the package, rather than on the side surfaces of the package body. However, the circuit boards integrated into these types of semiconductor packages are expensive and typically exhibit poor heat sink and electrical performance characteristics in comparison to semiconductor packages employing leadframes. In this regard, semiconductor packages or devices employing leadframes often exhibit good heat sink performance due to the semiconductor die being directly mounted on a metal (e.g., copper) die pad of the leadframe. Further, the die pad of the leadframe can be used as a ground area to improve the electrical properties of the semiconductor package. Such a structure is difficult to achieve in a semiconductor package employing a circuit board. Additionally, though certain BGA semiconductor packages include metal leadframes, the process of bending the leadframe to create the lands upon which the solder balls are ultimately formed often deforms the leadframe in a manner creating imperfect wiring bonding areas for the semiconductor die. These imperfections could potentially give rise to undesirable occurrences of stitch bond lift, wire shorting and/or sagging, mold void (imperfect molded state at the edges of a land), and mold flash (a state where resin smear remains on the exposed surface of a land).

The present invention provides a QFP exposed pad package which addresses the aforementioned needs by providing increased I/O with a reduced overall size and without the aforementioned drawbacks of the leadframe based BGA semiconductor packages described above. The QFP package of the present invention includes exposed leads and an exposed die pad on the bottom surface of the package body thereof, and additional leads which protrude from side surfaces of the package body. The QFP package of the present invention is also provided through the use of standard, low-cost leadframe design techniques. These, as well as other features and attributes of the present invention will be discussed in more detail below.

BRIEF SUMMARY OF THE INVENTION

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads are provided in two concentric rows or rings which at least partially circumvent the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body. In one embodiment of the present invention, those leads which do not protrude from a side surface of the package body are aligned with respective ones of a plurality of vias or openings which are formed in the package body and filled with a conductive metal material. In another embodiment of the present invention, at least portions of the bottom surfaces of the die pad and those leads which do not protrude from a side surface of the package body are exposed in a common exterior surface of the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
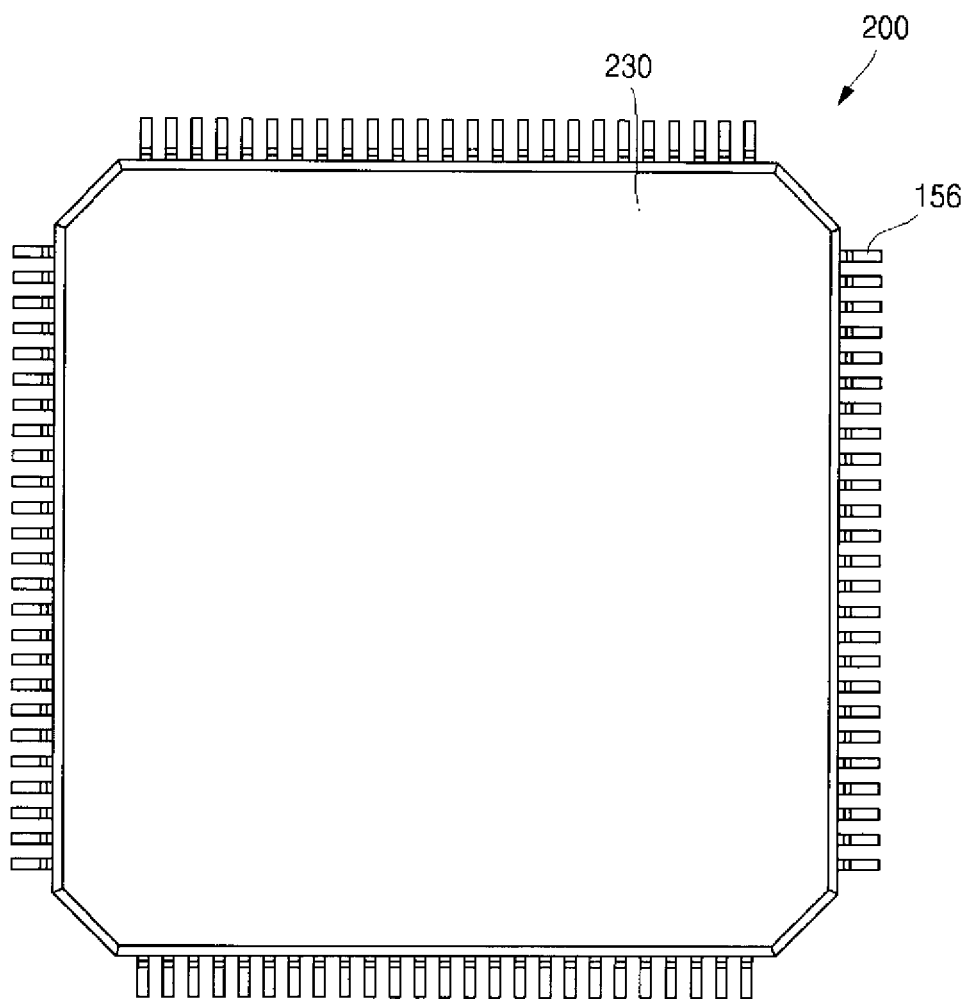
FIG. 1A is a top plan view of a semiconductor package constructed in accordance with a first embodiment of the present invention.
Figure 1B:
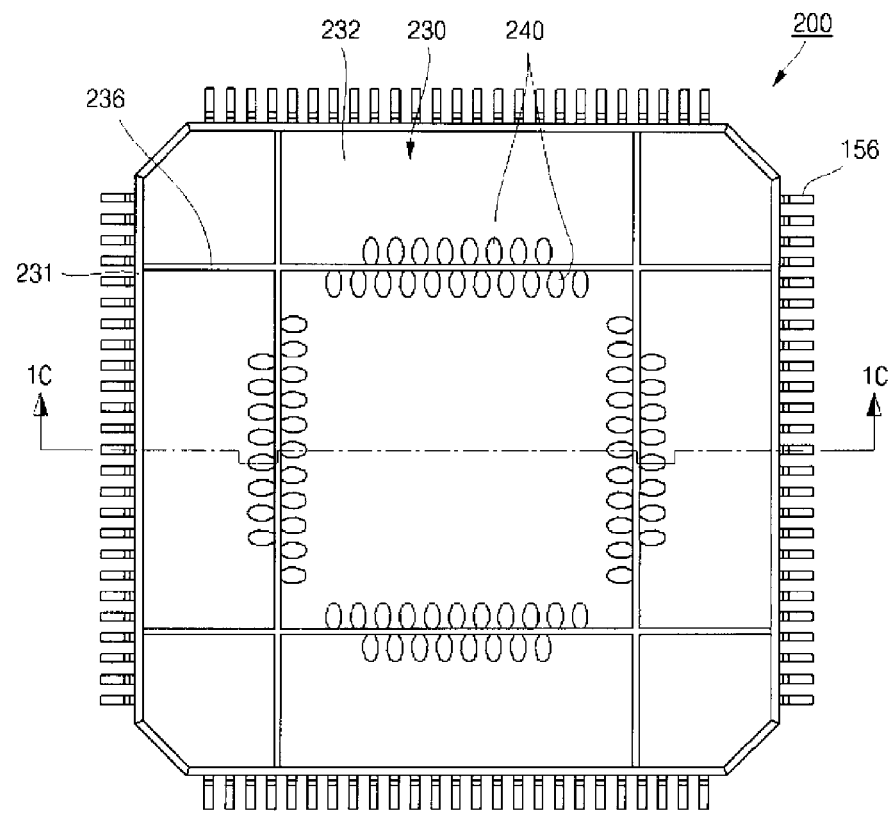
FIG. 1B is a bottom plan view of the semiconductor package shown in FIG. 1A.
Figure 1C:
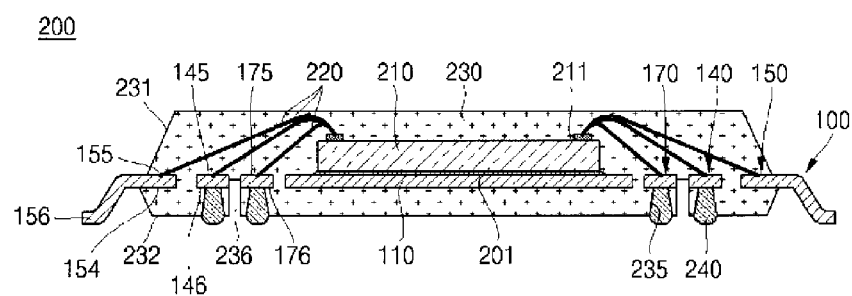
FIG. 1C is a cross-sectional view of the semiconductor package taken along line 1C-1C of FIG. 1B.
Figure 1D:
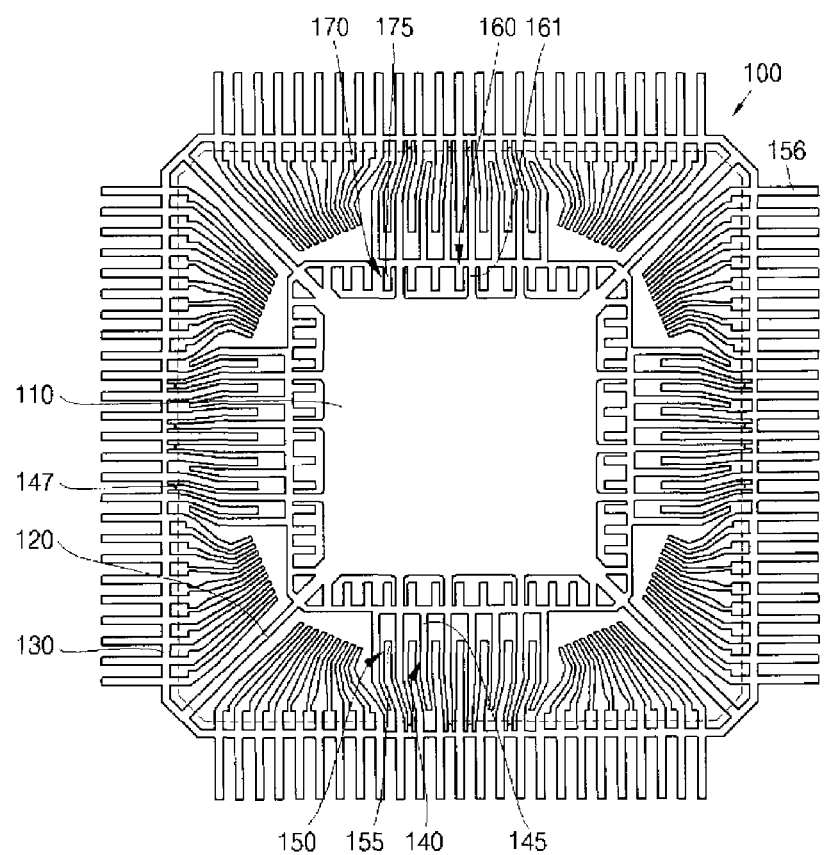
FIG. 1D is a top plan view of an unsingulated leadframe which is integrated into the semiconductor package shown in FIGS. 1A-1C.

Referring now to the drawings wherein the showings are for purposes of illustrating one embodiment of the present invention only, and not for purposes of limiting the same, FIG. 1D depicts a leadframe 100 for integration into a semiconductor package 200 constructed in accordance with a first embodiment of the present invention. The semiconductor package 200 is shown in FIGS. 1A, 1B and 1C.

Referring now to FIG. 1D, the leadframe 100 of the present invention comprises a generally quadrangular (e.g., square) die pad 110 which defines four peripheral edge segments and opposed, generally planar top and bottom surfaces. Integrally connected to the die pad 110 is a plurality of tie bars 120. More particularly, the leadframe 100 includes four tie bars 120 which extend diagonally from respective ones of the four corner regions defined by the die pad 110. Each of the tie bars 120 defines opposed, generally planar top and bottom surfaces which extend in generally coplanar relation to respective ones of the top and bottom surfaces of the die pad 110. The tie bars 120 are integrally connected to a dambar 130 which circumvents the die pad 110. In the leadframe 100, the dambar 130 is provided in the form of a substantially quadrangular (e.g., square) ring which interconnects the distal ends of the tie bars 120. As seen in FIG. 1D, the dambar 130 defines four peripheral segments which extend in spaced, generally parallel relation to respective ones of the peripheral edge segments of the die pad 110. The dambar 130 also defines opposed, generally planar top and bottom surfaces which extend in generally coplanar relation to respective ones of the top and bottom surfaces of the die pad 110. In a fabrication process for the semiconductor package 200 which will be described in more detail below, the dambar 130 is singulated or removed from the leadframe 100 to electrically isolate other structural features of the leadframe 100 from each other.

As indicated above, each of the tie bars 120 is integrally connected to the dambar 130. In addition, each of the tie bars 120 is integrally connected to a land connecting bar 160 which, like the dambar 130, circumvents the die pad 110. In this regard, the land connecting bar 160 includes four peripheral segments which extend in spaced, generally parallel relation to respective ones of the peripheral edge segments of the die pad 110. Additionally, the land connecting bar 160 is concentrically positioned between the dambar 130 and the die pad 110. The connecting bar 160 also defines opposed, generally planar top and bottom surfaces which extend in generally coplanar relation to respective ones of the top and bottom surfaces of the die pad 110. In a fabrication process for the semiconductor package 200, the land connecting bar 160, like the dambar 130, is also singulated or removed from the leadframe 100 to electrically isolate other structural features of the leadframe 100 from each other.

The leadframe 100 of the present invention further comprises a plurality of first leads 170 which are each integrally connected to the land connecting bar 160, and protrude inwardly toward the die pad 110. More particularly, the first leads 170 are segregated into four sets, with each set of the first leads 170 protruding inwardly from a respective one of the peripheral segments of the land connecting bar 160 toward the die pad 110. The first leads 170 of each set are arrange at a predetermined pitch and protrude perpendicularly inward at a predetermined length from a respective one of the peripheral segments of the land connecting bar 160. Each of the first leads 170 has a generally planar top surface which defines a bonding region 175 and extends in generally co-planar relation to the top surface of the die pad 110, and a generally planar bottom surface which extends in generally co-planar relation to the bottom surface of the die pad 110 and defines a land 176.

The leadframe 100 further comprises a plurality of support bars 161 which are integrally connected to and extend between the die pad 110 and the land connecting bar 160. In this regard, the support bars 161 function to connect the die pad 110 to and to support the die pad 110 within the interior of the land connecting bar 160. The support bars 161 are segregated into four sets, with each set of the support bars 161 extending generally perpendicularly between a respective one of the peripheral edge segments of the die pad 110 and a corresponding peripheral segment of the land connecting bar 160. As seen in FIG. 1D, certain ones of the support bars 161 extend between an adjacent pair of the first leads 170, with certain ones of the support bars 161 extending between a first lead 170 and a respective one of the tie bars 120. Each of the support bars 161 has a generally planar top surface which extends in generally co-planar relation to the top surface of the die pad 110, and a generally planar bottom surface which extends in generally co-planar relation to the bottom surface of the die pad 110.

The leadframe 100 of the semiconductor package 200 further comprises a plurality of second leads 140 which are integrally connected to the land connecting bar 160 and extend outwardly toward the dambar 130. More particularly, the second leads 140 are segregated into four sets, with the second leads 140 of each set being integrally connected to and extending generally perpendicularly outward from a respective one of the four peripheral segments defined by the land connecting bar 160. The second leads 140 of each set are arrange at a predetermined pitch and protrude generally perpendicularly outward at a predetermined length from a respective one of the peripheral segments of the land connecting bar 160. Each of the second leads 140 has a generally planar top surface which defines a bonding region 145 and extends in generally co-planar relation to the top surface of the die pad 110, and a generally planar bottom surface which extends in generally co-planar relation to the bottom surface of the die pad 110 and defines a land 146. The lands 146 further extends in generally co-planar relation to the lands 176 defined by the first leads 170. As is apparent from FIG. 1D, the lands 176 defined by the first leads 170 of each set are staggered or offset relative to the lands 146 defined by the second leads 140 of the corresponding set.

In the leadframe 100, some of the second leads 140 are integrally connected to the dambar 130, with other ones of the second leads 140 terminating so as to be disposed in spaced relation to the dambar 130. For those second leads 140 integrally connected to the dambar 130, such second leads 140 include tie bar portions 147 which facilitate the integral connection thereof to the dambar 130. The integral connection of some of the second leads 140 to the dambar 130 through the use of tie bar portions 147 functions to maintain the flatness of the land connecting bar 160, the first leads 170 and the second leads 140. When the dambar 130 is removed in a subsequent fabrication step for the semiconductor package 200, the tie bar portions 147 of the second leads 140 including the same do not protrude from the package body of the semiconductor package 200. Accordingly, the tie bar portions 147 can be electrically connected to an external device only via the land 146 of the corresponding second lead 140. As indicated above, in the leadframe 100, the second leads 140 of each set are preferably formed so as to be staggered or offset relative to the first leads 170 of the corresponding set thereof, as seen in FIG. 1D. However, as is also seen in FIG. 1D, it is contemplated that certain ones of the second leads 140 of each set may be linearly aligned with respective ones of the support bars 161 of that set attached to the corresponding peripheral edge segment of the die pad 110.

The leadframe 100 constructed in accordance with the present invention further comprises a plurality of third leads 150 which are integrally connected to the dambar 130. More particularly, the third leads 150, like the first and second leads 170, 140, are preferably segregated into four sets, with each set of the third leads 150 extending between an adjacent pair of the tie bars 120. The third leads 150 of each set also extend generally perpendicularly relative to a respective one of the peripheral segments of the dambar 130 at a predetermined length, the third leads 150 of each set also being arranged at a predetermined pitch. Additionally, certain ones of the third leads 150 of each set have a generally linear configuration, and extend between a respective, adjacent pair of the second leads 140 in spaced relation thereto. Those third leads 150 of each set which do not extend between an adjacent pair of the second leads 140 each preferably have an angled configuration so as to be disposed closer to a respective one of the peripheral edge segments of the die pad 110.

In the leadframe 100 constructed in accordance with the present invention, each of the third leads 150 integrally connected to the dambar 130 includes an inner portion 154 which extends inwardly from the dambar 130 toward the die pad 110 in spaced relation thereto, and an outer portion 156 which extends outwardly from the dambar 130 away from the die pad 110. More particularly, the inner portion 154 of each of the third leads 150 extends inwardly from the dambar 130 toward the die pad 110, and is disposed between the dambar 130 and the land connecting bar 160. The inner portion 154 of each of the third leads 150 has a generally planar top surface which defines a bonding region 155 and extends in generally co-planar relation to the top surface of the die pad 110, and a generally planar bottom surface which extends in generally co-planar relation to the bottom surface of the die pad 110. When the leadframe 100 is in it original, unsingulated state as shown in FIG. 1D, the outer portion 156 of each of the third leads 150 also defines opposed, generally planar top and bottom surfaces which extend in generally co-planar relation to respective ones of the top and bottom surfaces of the inner portions 154, and hence respective ones of the top and bottom surfaces of the die pad 110. However, as will be described in more detail below, in the completed semiconductor package 200 shown in FIG. 1C, the outer portion 156 of each of the third leads 150 is bent to assume a generally gull-wing configuration. Based on the structural attributes of the leadframe 100 as described above, the bonding areas 175, 145, 155 of the first, second and third leads 170, 140, 150 each extend in generally co-planar relation to each other, and to the top surface of the die pad 110. These bonding regions 175, 145, 155 provide areas for the electrical bonding of conductive wires, as will be described in more detail below. Similarly, the lands 176, 146 of the first and second leads 170, 140 each extend in generally co-planar relation to each other, and to the bottom surface of the die pad 110

In the process of fabricating the semiconductor package 200 as will be described in more detail below, the dambar 130 is ultimately singulated in a manner wherein the third leads 150 are electrically isolated from each other, and from those second leads 140 which are originally integrally connected to the dambar 130 by respective ones of the tie bar portions 147. The singulation of the land connecting bar 160 occurs in a manner wherein the first leads 170 are electrically isolated from each other, and from the second leads 140. As will be recognized, the singulation of the land connecting bar 160, coupled with the singulation of the dambar 140, also facilitates the electrical isolation of the second leads 140 from each other, and from the first leads 170.

The leadframe 100 may be fabricated from a conventional metal material, such as copper, copper alloy, steel plated with copper, or a functional equivalent. However, those of ordinary skill in the art will recognize that the present invention is not limited to any particular material for the leadframe 100. It is contemplated that for ease of wire bonding, gold or silver may be plated on the wire bonding regions 175, 145, 155 as well. Alternatively, as indicated above, the leadframe 100 may be a pre-plated leadframe (PPF) to provide enhanced wire bonding regions 175, 145, 155. Additionally, the number of first, second and third leads 170, 140, 150 shown in FIG. 1D is for illustrative purposed only, and may be modified according to application field. Along these lines, the first, second and third leads 170, 140, 150 may each have designs or configurations varying from those shown in FIG. 1D without departing from the spirit and scope of the present invention. Additionally, though the first, second and third leads 170, 140, 150 are each shown as being segregated into four sets, it will be recognized that fewer sets thereof may be provided, and may be arranged along any combination of two or three of the peripheral sides of the die pad 110. Moreover, less than four tie bars 120 may be included in the leadframe 100, extending to respective corners of the die pad 110 in any combination. It is further contemplated that the leadframe 100 may be fabricated through the implementation of a chemical etching process or alternatively a mechanical stamping process.

As will be recognized by the foregoing description of the leadframe 100, when the leadframe 100 is in its original, unsingulated state, no downsets are formed in any portion thereof. Thus, as also indicated above, the lands 176, 146 extend in generally co-planar relation to each other and to the bottom surface of the die pad 110, with the bonding regions 175, 145, 155 also extending in generally co-planar relation to each other and to the top surface of the die pad 110. Since no downsets are formed in the leadframe 100, the manufacturing process related thereto can be simplified. Additionally, the flatness of the lands 176, 146 is more easily maintained, since they are less susceptible to deformation as may otherwise occur if the leadframe 100 was subjected to a down-setting process. Along these lines, as also previously explained, the process of bending leadframes to create lands upon which solder balls may ultimately be formed often deforms the leadframe in a manner creating imperfect wire bonding areas or regions for the semiconductor die. In the leadframe 100, the flatness of the lands 176, 146 is further assisted by the attachment of the land connecting bar 160 to the die pad 110 through the use of the support bars 161.

Referring now to FIGS. 1A, 1B and 1C, the semiconductor package 200 as fabricated to include the leadframe 100 is shown in detail. As will be recognized by those of ordinary skill in the art, in the completed semiconductor package 200, the dambar 130 and the land connecting bar 160 are each singulated or removed from the leadframe 100 to facilitate the electrical isolation of the first, second and third leads 170, 140, 150 of the leadframe 100 from each other. In the semiconductor package 200, a semiconductor die 210 is attached to the top surface of the die pad 110 through the use of an adhesive layer 201. The adhesive layer 201 is preferably a film adhesive with low water absorption so as to prevent the adhesive layer 201 from being separated from the semiconductor die 210 and from the die pad 110 of the leadframe 100. The semiconductor die 210 includes a plurality of bond pads 211 which are disposed on the top surface thereof opposite the bottom surface adhered to the adhesive layer 201. The bond pads 211 are used to deliver and receive electrical signals.

The semiconductor package 200 further comprises a plurality of conductive wires 220 which are used to electrically connect the bond pads 211 of the semiconductor die 201 to respective ones of the first, second and third leads 170, 140, 150. The conductive wires 220 may be fabricated from aluminum, copper, gold, silver, or a functional equivalent. However, those of ordinary skill in the art will recognize that the present invention is not limited to any particular material for the wires 220. One or more conductive wires 220 may also be used to electrically connect one or more bond pads 211 of the semiconductor die 210 directly to the die pad 110. In this regard, though not shown, the peripheral edge portion of the top surface or the entire top surface of the die pad 110 may be plated and bonded with conductive wires 220, allowing for the use of the plated die pad 110 as a ground region.

In the semiconductor package 200, in electrically connecting the bond pads 211 to the first leads 170, it is contemplated that the conductive wires 220 will be extended from the bond pads 211 to the wire bonding regions 175 defined by the first leads 170. In electrically connecting the bond pads 211 to the second leads 140, it is contemplated that the conductive wires 220 will be extended from the bond pads 211 to the wire bonding regions 145 defined by the second leads 140. The electrical connection of the bond pads 211 of the semiconductor die 210 to the third leads 150 is preferably facilitated by extending the conductive wires 220 from the bond pads 211 to the wire bonding regions 155 defined by the inner portions 154 of respective ones of the third leads 150. Since the wire bonding regions 175, 145, 155 extend in generally co-planar relation to each other, the conductive wires 220 can be bonded to the wire bonding regions 175, 145, 155 by repeatedly reciprocating capillaries at the same height to maintain constant wiring bonding quality.

In the semiconductor package 200, the die pad 110, the tie bars 120, the first leads 170, the second leads 140, the third leads 150, the semiconductor die 210 and the conductive wires 220 are at least partially encapsulated or covered by an encapsulant material which, upon hardening, forms a package body 230 of the semiconductor package 200. Prior to the removal of the dambar 130 and land connecting bar 160 of the leadframe 100 during the fabrication of the semiconductor package 200, the package body 230 covers the entirety of the die pad 110, the entirety of each of the first leads 170, the entirety of each of the second leads 140 except for the tie bar portions 147 of those second leads 140 including the same, a substantial portion of the inner portion 154 of each of the third leads 150, and a substantial portion of each of the tie bars 120.

The outer portions 156 of the third leads 150 are not covered by the package body 230, but rather protrude or extend outwardly from respective lateral side surfaces 231 thereof. The dambar 130 is also not covered by the package body 230 so that it may be easily removed or singulated from the leadframe 100. Though the land connecting bar 160 of the unsingulated leadframe 100 is fully covered by the package body 230 upon the initial formation thereof, the land connecting bar 160, in addition to the dambar 130, is ultimately removed from the leadframe 100 in a manner which will be described in more detail below.

As previously explained, to allow the semiconductor package 200 to possess the structural attributes shown in FIGS. 1A, 1B and 1C, the dambar 130 and the land connecting bar 160 must be removed from the leadframe 100 to facilitate the electrical isolation of the first, second and third leads 170, 140, 150 from each other. As will be described in more detail below, the removal of the land connecting bar 160 is typically accomplished through the completion of a partial sawing process. This sawing process facilitates the formation of a plurality of elongate grooves 236 within the bottom surface 232 of the package body 230, such grooves 236 extending in generally perpendicular relation to each other, and generally perpendicularly between opposed pairs of the lateral side surfaces 231 of the package body 230. As will also be described in more detail below, it is contemplated that a conventionally known debarring process may be implemented to remove the dambar 130 during the process of fabricating the semiconductor package 200 due to such dambar 130 not being covered by the fully formed package body 230 as indicated above. The completion of such debarring process results in those second leads 140 including a tie bar portion 147 defining an outer, distal end which us exposed in and substantially flush with a respective side surface 231 of the package body 230. Once the dambar 130 has been removed, the exposed outer portions 156 of the third leads 150 of each set thereof which protrude laterally outward from respective side surfaces 231 of the package body 230 may be bent to assume a gull-wing configuration to allow the same to be electrically connected to an underlying substrate such as a printed circuit board. As previously explained, the removal of the land connecting bar 160 is facilitated by sawing with a blade, the grooves 236 being formed as an artifact of such sawing process.

As is best seen in FIG. 1C, despite the first and second leads 170, 140 being electrically isolated from each other as a result of the removal of the land connecting bar 160 from the leadframe 100, the package body 230 must ultimately assume a configuration which facilitates the ability to electrically connect the first and second leads 170, 140 to an external structure or underlying substrate. The ability to electrically connect the third leads 150 to an external structure is facilitated by the exposed outer portions 156 thereof which, as indicated above, are typically bent to assume a gull-wing configuration. To accomplish this objective, in the semiconductor package 200, a plurality of vias or openings 235 are preferably formed in the generally planar bottom surface 232 of the package body 230, such openings 235 being vertically aligned with respective ones of the lands 176, 146 when viewed from the perspective shown in FIG. 1C. Each of the openings 235 preferably has a generally tapered configuration, and is of a first width at the bottom surface 232 which exceeds a second width at a respective one of the lands 176, 146. Each of the openings 235 is preferably filled with a solder ball 240. Each solder ball 240 is sized and configured so as to directly contact and thus be electrically connected to a respective one of the lands 176, 146, with a portion of each solder ball 240 further protruding from the bottom surface 232 of the package body 230 in the manner shown in FIG. 1C. It is contemplated that the openings 235 may each be formed by laser drilling or chemical etching subsequent to the formation of the package body 230. Alternatively, the openings 235 may be formed during the molding of the package body 230 through the use of a pin mold wherein a plurality of pins protrude upwardly into the mold cavity conforming to the package body 230, each of the pins being abutted against a respective one of the lands 176, 146. However, those of ordinary skill in the art will recognize that the process for forming the openings 235 is not necessarily limited to those described above. The solder balls 240 assume the general shape of the corresponding openings 235, and thus also each have a tapered configuration. Each of the solder balls 240 may be made of one of Sn—Pb, Sn—Pb—Ag, Sn—Pb—Bi, Sn—Cu, Sn—Ag, Sn—Ag—Bi, Sn—Zn, and equivalents thereof, though the present invention is not intended to be limited to any particular material for the solder balls 240. As will be recognized, the solder balls 240, when electrically connected to respective ones of the lands 176, 146, provide a modality for facilitating the electrical connection of the first and second leads 170, 140 to an underlying substrate.

In the completely formed semiconductor package 200, the grooves 236 formed in the package body 230 as a result of the sawing process used to facilitate the removal of the land connecting bar 160 effectively electrically insulate the first and second leads 170, 140 from each other. As seen in FIG. 1C, though electrically isolating the first and second leads 170, 140 from each other, end surfaces of such first and second leads 170, 140 are exposed in the grooves 236 subsequent to the completion of the sawing process used to form the same.

The semiconductor package 200 constructed in accordance with the present invention provides an increased number of input and output pins defined by the solder balls 240 which, as indicated above, are electrically connected to respective ones of the lands 176, 146 of the first and second leads 170, 140. In the semiconductor package 200, the die pad 110, first and second leads 170, 140, and the inner portions 154 of the outer leads 150 reside on a common plane, with only the exposed outer portions 156 of the third leads 150 ultimately being subjected to a bending process. Accordingly, as indicated above, the manufacturing process for the semiconductor package 200 is simplified since the leadframe 100 thereof is not subjected to a down-setting process, such simplification also resulting in a reduction in manufacturing costs and the elimination of the potential structural deficiencies in the leadframe 100 highlighted above. The absence of such structural deficiencies is largely attributable to the fact that the leadframe 100 is not mechanically deformed as would otherwise occur as the result of the completion of a down-setting process thereon. Thus, in the semiconductor package 200, potential drawbacks such as stitch bond lift, wire shorting and sagging, etc. which could otherwise occur during wire bonding as a result of the deformation in the leadframe 100 can, in large measure, be eliminated. As also mentioned above, since the bonding regions 175, 145, 155 are of the same height (i.e., co-planar), the wire bonding can be completed by a capillary reciprocating at the same height, thus allowing for the achievement of uniform wire bonding. Further, since the electrical connection of the first and second leads 170, 140 to an external structure or device is facilitated by the solder balls 240 without the first and second leads 170, 140 being directly exposed in the bottom surface 232 of the package body 230, the process of fabricating the semiconductor package 200 does not give rise to occurrences of mold void (imperfect molded state at the edges of a land), or a mold flash (a state where resin smear remains on an exposed surface of a land) which, as indicated above, often occurs in manufacturing processes for semiconductor packages including exposed lands.

Figure 4:
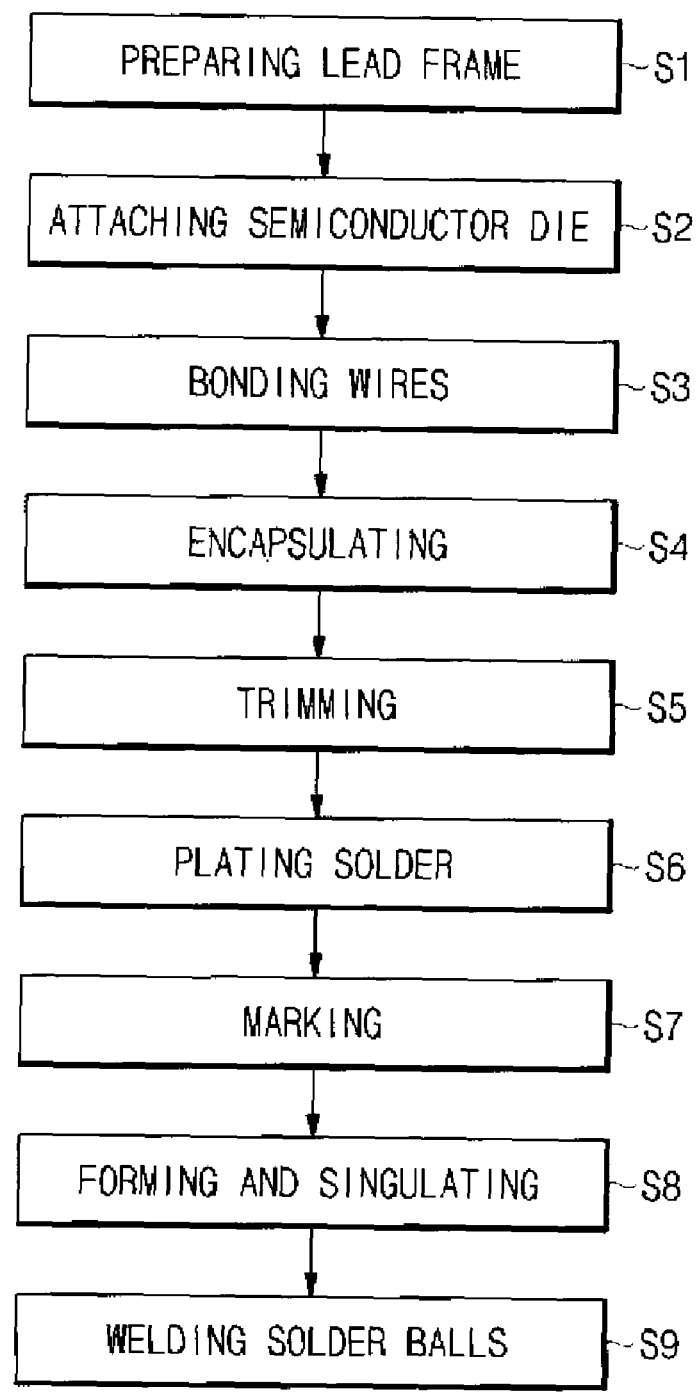
FIG. 4 is a flow chart illustrating an exemplary fabrication method for the semiconductor package shown in FIGS. 1A-1C.

Referring now to FIG. 4, there is provided a flow chart which sets forth an exemplary method for fabricating the semiconductor package 200 of the present invention. The method comprises the steps of preparing the leadframe (S1), semiconductor die attachment (S2), wire bonding (S3), encapsulation (S4), trimming (S5), solder plating (S6), marking (S7), forming and singulation (S8), and solder ball welding (S9). FIGS. 5A-5L provide illustrations corresponding to these particular steps, as will be discussed in more detail below.

Figure 5A:
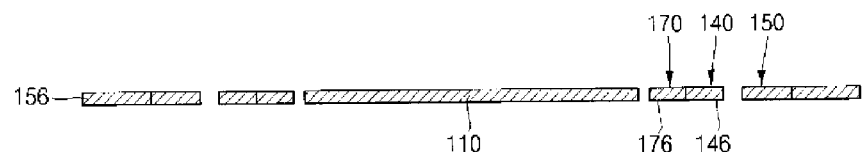
FIGS. 5A-5L are views illustrating an exemplary fabrication method for the semiconductor package shown in FIGS. 1A-1C.
Figure 5B:
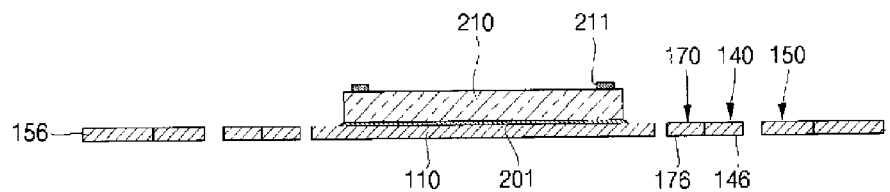

Referring now to FIG. 5A, in the initial step S1 of the fabrication process for the semiconductor package 200, the leadframe 100 having the above-described structural attributes is provided. Thereafter, as illustrated in FIG. 5B, step S2 is completed wherein the semiconductor die 210 having the bond pads 211 is attached to the top surface of the die pad 110 of the leadframe 100 through the use of the adhesive layer 201. The adhesive layer 201 can be selected from well known liquid epoxy adhesives, adhesive films and adhesive tapes, as well as equivalents thereto.

Figure 5C:
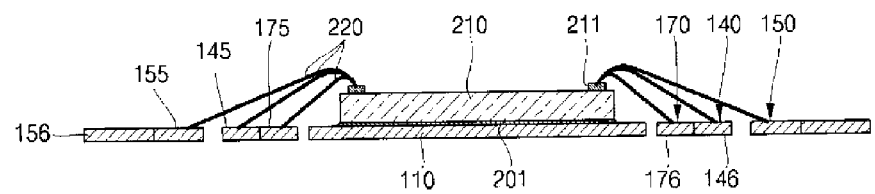
Figure 5D:
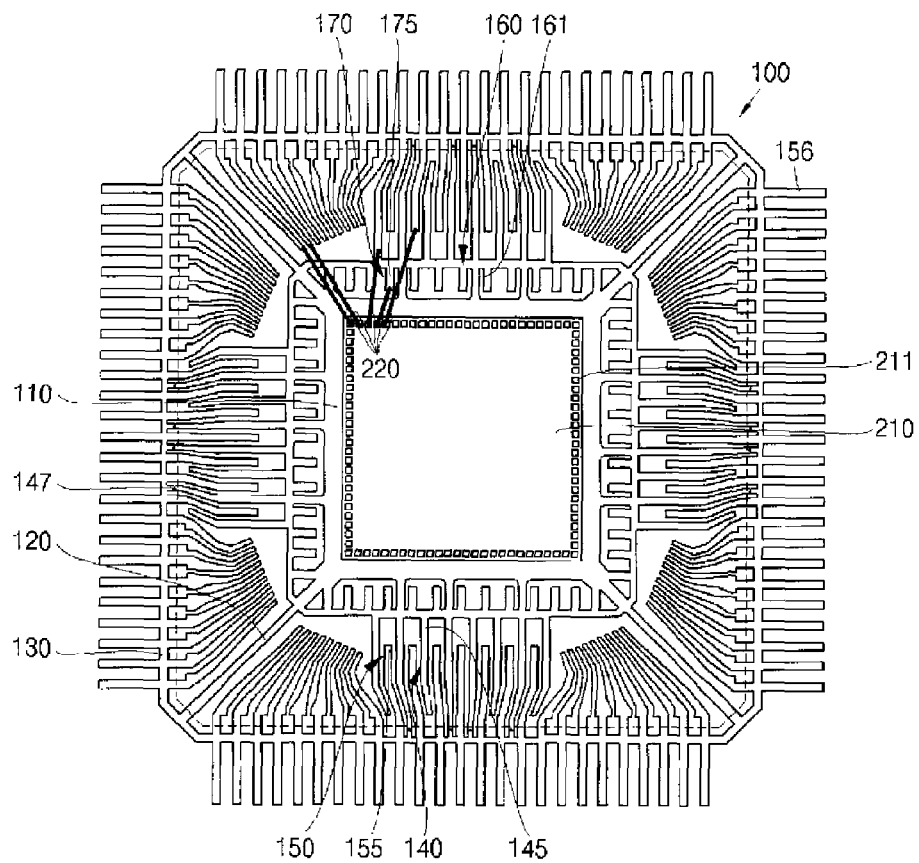

Referring now to FIGS. 5C and 5D, in the next step S3 of the fabrication process for the semiconductor package 200, the conductive wires 220 are used to electrically connect the semiconductor die 210 to the leadframe 100 in the aforementioned manner. Specifically, the bond pads 211 of the semiconductor die 210 are electrically connected to respective ones of the bonding regions 175, 145, 155 of the first, second and third leads 170, 140, 150 in the aforementioned manner. Though not shown, as indicated above, one or more conductive wires 220 may also be used to electrically connect one or more bond pads 211 of the semiconductor die 210 directly to the die pad 110, allowing for the use of the die pad 110 as a ground region.

Figure 5E:
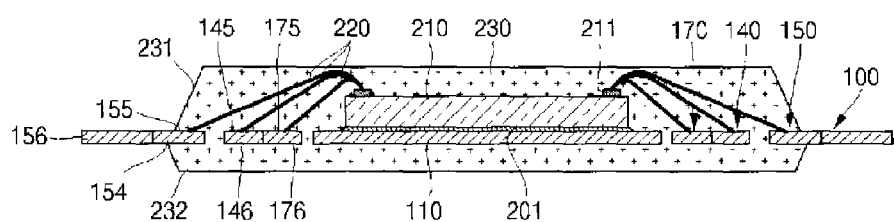

Referring now to FIG. 5E, in the next step S4 of the fabrication process for the semiconductor package 200, portions of the leadframe 100, the semiconductor die 210 and the conductive wires 220 are encapsulated with an encapsulant material which, upon hardening, forms the package body 230 of the semiconductor package 200. More particularly, the package body 230 covers the entirety of the semiconductor die 210, the entirety of the conductive wires 220, the entirety of the die pad 110, the entirety of the support bars 161, the entirety of the first leads 170, the entirety of the land connecting bar 160, the entirety of the second leads 140 except for the tie bar portions 147 of those second leads 140 including the same, substantial portions of the tie bars 220, and substantial portions of the inner portions 154 of the third leads 150. However, the package body 230 does not cover the dambar 130, or the outer portions 156 of the third leads 150. Additionally, as indicated above, the package body 230 also does not cover the tie bar portions 147 of those second leads 140 including the same. Though the land connecting bar 160 is covered by the package body 230, the same is singulated or removed from the leadframe 100 by a sawing process which is described in more detail below.

Figure 5F:
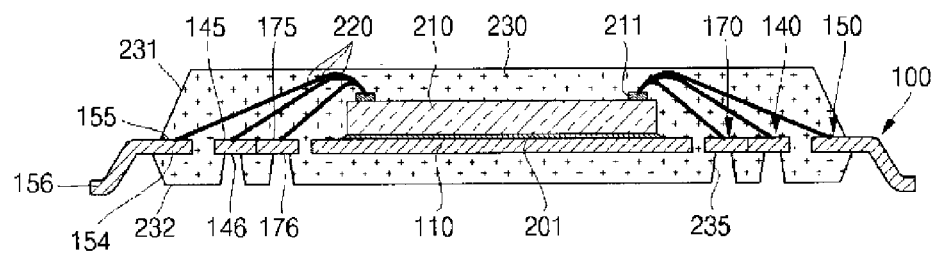
Figure 5G:
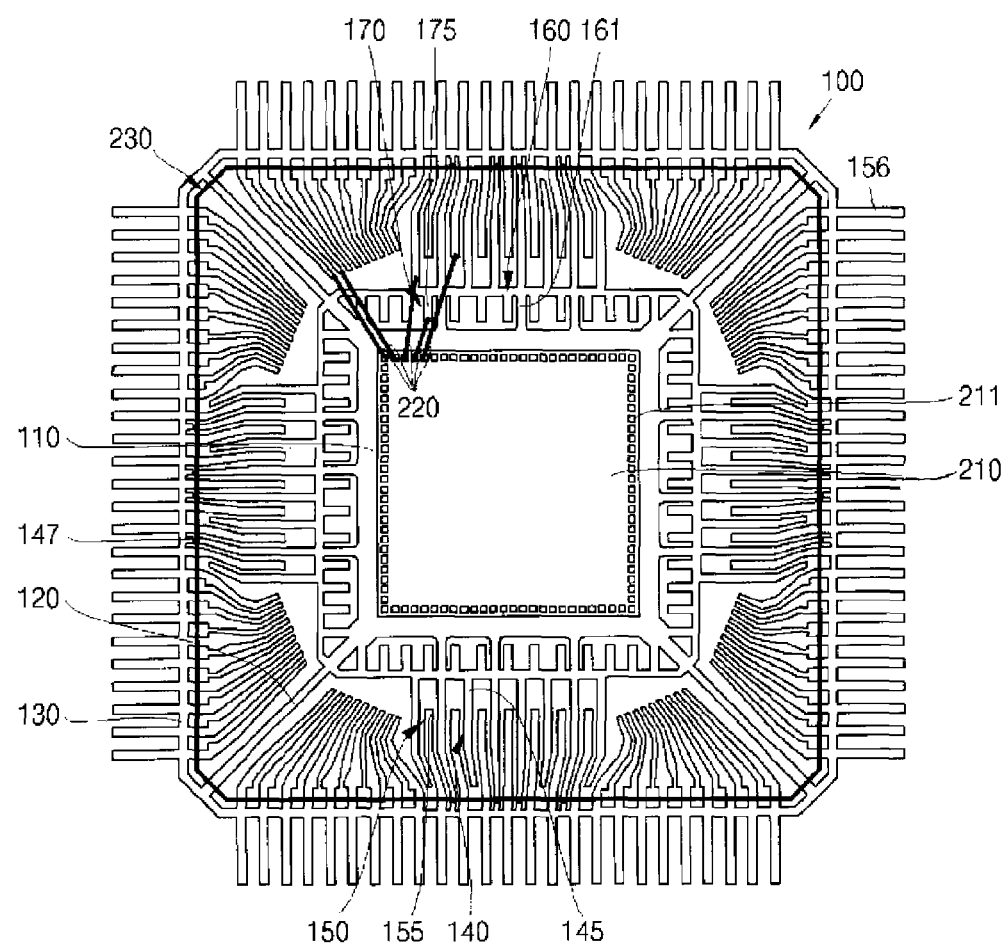

As part of the encapsulation step S4, the formation of the package body 230 as shown in FIG. 5E is followed by the formation of the openings 235 in the bottom surface 232 of the package body 230 as shown in FIG. 5F. The openings 235 are formed through the completion of any one of the techniques described above. As previously explained, each of the openings 235 is preferably formed to have a tapered configuration, and is oriented within the bottom surface 232 of the package body 230 so as to be aligned with a respective one of the lands 176, 146 defined by the first and second leads 170, 140. FIG. 5G provides a top plan view depicting the orientation of the fully formed package body 230 relative to the unsingulated leadframe 100. The dambar 130 is not covered by the package body 230 so that it may be removed from the leadframe 100.

Figure 5H:
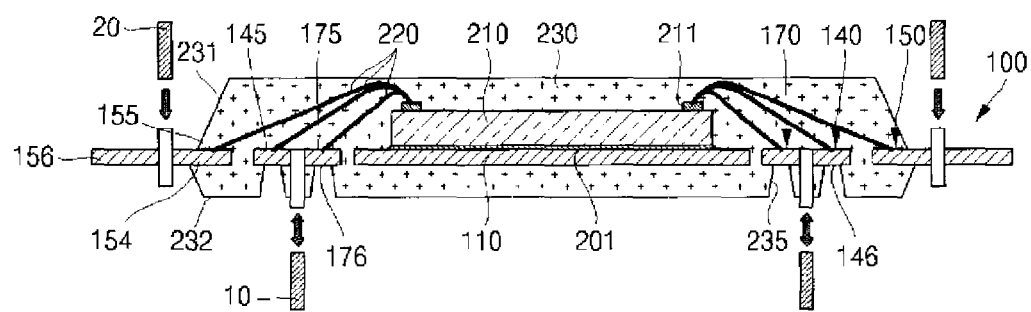
Figure 5I:
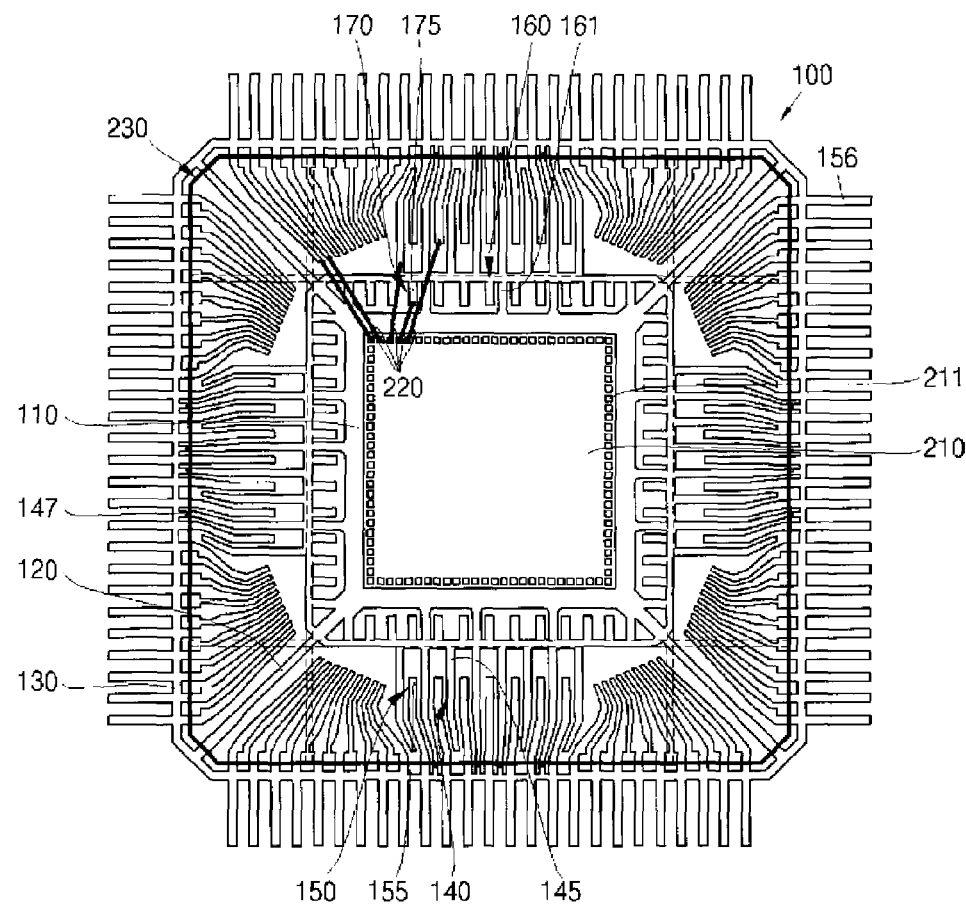

Referring now to FIGS. 5H and 5I, in the next step S5 of the fabrication process for the semiconductor package 200, the removal of the land connecting bar 160 is facilitated by sawing with a blade 10, the grooves 236 shown in FIG. 1B and FIG. 5I being formed as an artifact of such sawing process. Additionally, the exposed dambar 130 is trimmed or removed by cutting with a cutting tool 20. As previously explained, the dambar 130 is positioned outside of the package body 230 to allow for the removal thereof from the leadframe 100, and is removed by cutting the same with the dambar cutting tool 20. In addition, the tie bar portions 147 of the second leads 140 protruding from the side surfaces 231 of the package body 230 are removed during the trimming process. The removal of the dambar 130 and the land connecting bar 160 facilitates the electrical isolation of the first, second and third leads 170, 140, 150 from each other as described above.

Upon the completion of step S5, a solder plating step (step S6) may also be performed in the fabrication process for the semiconductor package 200. More particularly, after the land connecting bar 160, dambar 130 and the tie bar portions 147 of the second leads 140 have been removed, some metal areas of the leadframe 100 susceptible to oxidation are exposed to air. Since the leadframe 100 is typically made of copper, the same is susceptible to oxidation. In order to prevent the oxidation of the exposed metal areas of the leadframe 100, such exposed elements may be plated by soldering. Subsequent to the completion of any such solder plating step (step S6), a marking step (step S7) may be performed upon the semiconductor package 200. More particularly, ink or a laser may be used to mark the product name, the manufacturer of the semiconductor package 200, etc. on a prescribed surface of the package body 230.

Figure 5J:
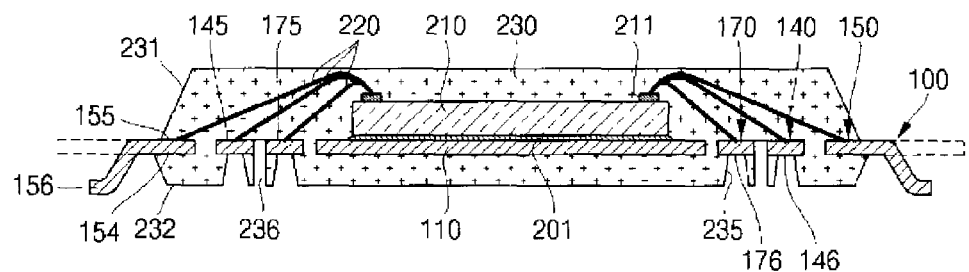

Referring now to FIG. 5J, in the next step S8 of the fabrication process for the semiconductor package 200, the outer portion 156 of the third leads 150 protruding from the side surfaces 231 of the package body 230 are formed in appropriate shapes. Specifically, the exposed outer portions 156 may be formed into predetermined shapes using a lead forming tool (not shown) to allow the semiconductor package 200 to have a shape suitable for mounting to an external unit or an underlying substrate. Although the outer portions 156 are depicted as being formed outwardly relative to the package body 230 in FIG. 5J, those of ordinary skill in the art will recognize that the outer portions 156 can alternatively be formed downwardly and inwardly relative to the package body 230. Thereafter, portions of the tie bars 120 protruding outwardly from the package body 230 are cut to separate the semiconductor package 200 from exposed portions of the leadframe 100.

Figure 5K:
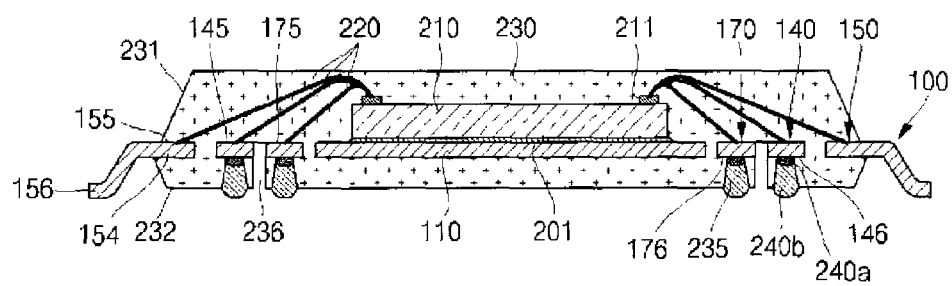
Figure 5L:
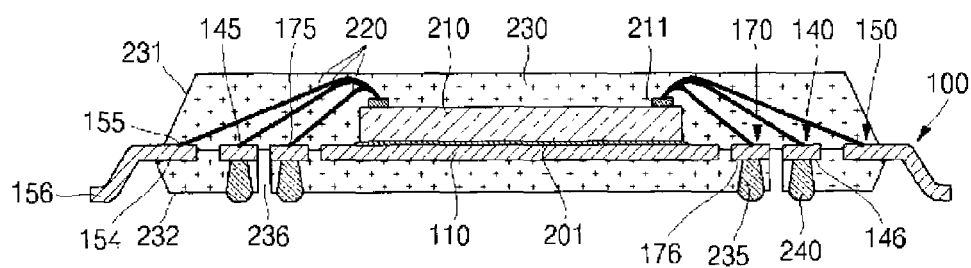

Referring now to FIGS. 5K and 5L, in the next step S9 of the fabrication process for the semiconductor package 200, the solder balls 240 are electrically connected or welded to respective ones of the lands 176, 146 of the first and second leads 170, 140. As indicated above, each of the lands 176, 146 is at least partially exposed in a respective one of the openings 235 formed in the package body 230 in accordance with step S4 described above. As shown in FIG. 5K, step S9 initially comprises coating solder flux 240a onto each of the lands 176, 146 through respective ones of the openings 235. Thereafter, solder material 240b is coated onto the solder flux 240a on each of the lands 176, 146. When a reflow process is performed after sequentially coating the solder flux 240a and the solder material 240b to the lands 176, 146, the volatile solder flux 240a is essentially vaporized, with the solder balls 240 formed from the solder material 240b being welded directly to respective ones of the lands 176, 146. As also indicated above, portions of the solder balls 240 protrude from respective ones of the openings 235 outwardly relative to the generally planar bottom surface 232 of the package body 230.

Figure 2:
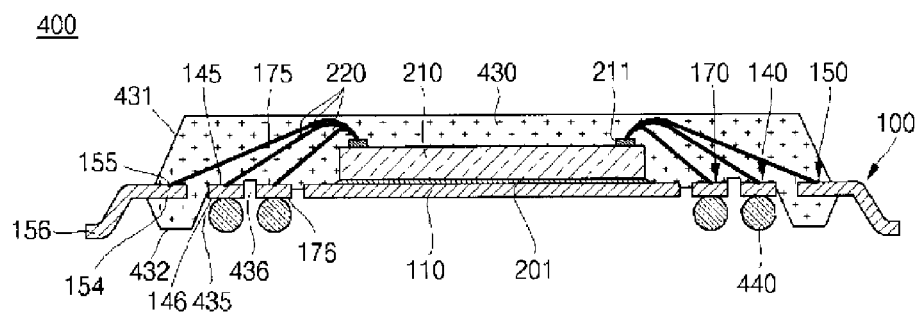
FIG. 2 is a cross-sectional view of a semiconductor package constructed in accordance with a second embodiment of the present invention.

Referring now to FIG. 2, there is shown a semiconductor package 400 constructed in accordance with a second embodiment of the present invention. The semiconductor package 400 is similar in structure to the semiconductor package 200 described above, with only the differences between the semiconductor packages 400, 200 being described below.

The semiconductor package 400 includes the same leadframe 100 described above in relation to the semiconductor package 200. Additionally, the semiconductor package 400 also includes the semiconductor die 210 and the conductive wires 220 which are mechanically and electrically connected to the leadframe 100 in the same manner described above in relation to the semiconductor package 200. Thus, the sole distinction between the semiconductor packages 400, 200 lies in the structural attributes of the package body 430 of the semiconductor package 400 in comparison to the package body 230 of the semiconductor package 200.

More particularly, during the fabrication of the semiconductor package 400, the initially formed package body 430 covers the entirety of the semiconductor die 210, the entirety of the conductive wires 220, the entirety of the die pad 110, the entirety of each of the first leads 170, the entirety of each of the second leads 140 except for the tie bar portions 147 of those second leads 140 including the same, a substantial portion of the inner portion 154 of each of the third leads 150, and a substantial portion of each of the tie bars 120. The outer portions 156 of the third leads 150 are not covered by the package body 430, but rather protrude or extend outwardly from respective lateral side surfaces 431 thereof. The dambar 130 is also not covered by the package body 430 so that it may be easily removed or singulated from the leadframe 100. Though the land connecting bar 160 of the unsingulated leadframe 100 is fully covered by the package body 430 upon the initial formation of the same, the land connecting bar 160, in addition to the dambar 130, is ultimately removed from the leadframe 100 in a manner which will be described in more detail below.

As with the semiconductor package 200, for the semiconductor package 400 to possess the structural attributes shown in FIG. 2, the dambar 130 and the land connecting bar 160 must be removed from the leadframe 100 to facilitate the electrical isolation of the first, second and third leads 170, 140, 150 from each other. In the process of fabricating the semiconductor package 400, a recess 435 is formed in the generally planar bottom surface 432 of the package body 430, such recess 435 being sized and configured to effectively expose the lands 176, 146 of the first and second leads 170, 140, as well as the generally planar bottom surface of the die pad 110 in the manner shown in FIG. 2. As seen in FIG. 2, it is contemplated that the recess 435 may be formed such that the side walls thereof are inwardly angled or tapered as they extend from the bottom surface 432 toward the second leads 140. The recess 435 may be formed through the completion of processes such as laser drilling or chemical etching, or may alternatively be formed during the molding of the semiconductor package 430 through the use of an appropriately shaped mold cavity.

In the process of fabricating the semiconductor package 400, even after the lands 176, 146 and the bottom surface of the die pad 110 are exposed as a result of the formation of the recess 435, the land connecting bar 160 (as well as the dambar 130) must still be removed from the leadframe 100 to facilitate the electrical isolation of the first, second and third leads 170, 140, 150 from each other as indicated above. Subsequent to the formation of the recess 435, the removal of the land connecting bar 160 is accomplished through the completion of a partial sawing process. This sawing process facilitates the formation of a plurality of elongate grooves 436 within the bottom surface of the recess 435, such grooves 436 extending in generally perpendicular relation to each other, and generally perpendicularly between opposed pairs of the sloped side surfaces of the recess 435. It is also contemplated that a conventionally known debarring process may be implemented to remove the dambar 130 during the process of fabricating the semiconductor package 400 due to such dambar 130 not being covered by the fully formed package body 430. The completion of such debarring process results in those second leads 140 including a tie bar portion 147 defining an outer, distal end which is exposed in and substantially flush with a respective side surface 431 defined by the package body 430. Once the dambar 130 has been removed, the exposed outer portions 156 of the third leads 150 of each set thereof which protrude laterally outward from respective side surfaces 431 of the package body 430 may be bent to assume a gull-wing configuration to allow the same to be electrically connected to an underlying substrate such as a printed circuit board. As indicated above, the removal of the land connecting bar 160 is facilitated by sawing with a blade, the grooves 436 being formed as an artifact of such sawing process.

In the completely formed semiconductor package 400, the grooves 436 formed in the package body 430 as a result of the sawing process used to facilitate the removal of the land connecting bar 160 effectively electrically insulate the first and second leads 170, 140 from each other. As seen in FIG. 2, though electrically insulating the first and second leads 170, 140 from each other, end surfaces of such first and second leads 170, 140 are exposed in the grooves 436 subsequent to the completion of the sawing process used to form the same.

Once the first and second leads 170, 140 are electrically isolated from each other by the removal of the land connecting bar 160, solder balls 440 are electrically connected to respective ones of the lands 176, 146 defined by the first and second leads 170, 140. Each of the solder balls 440 may be made of any one of the same materials identified above in relation to the solder balls 240 of the semiconductor package 200. The semiconductor package 400 provides many of the advantages discussed above in relation to the semiconductor package 200, but also provides the advantage of a heat-radiation function attributable to the exposure of the bottom surface of the die pad 110 within the recess 435.

Figure 6:
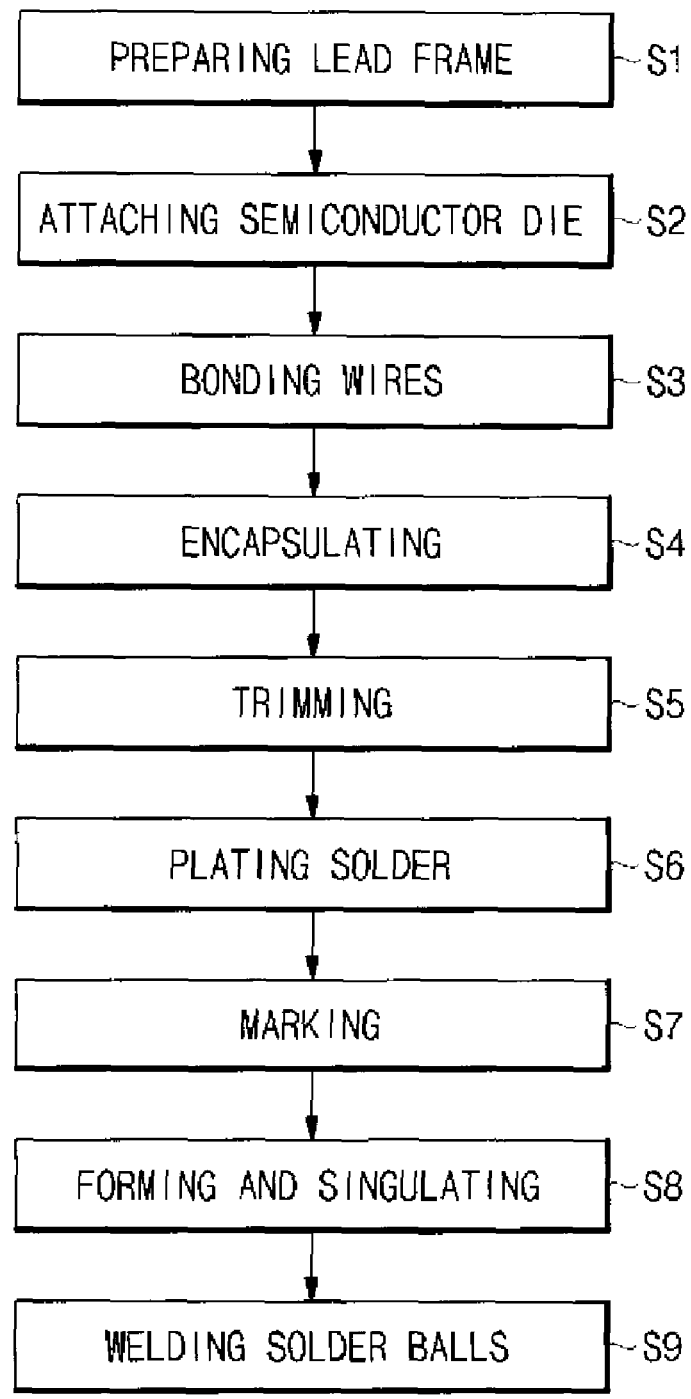
FIG. 6 is a flow chart illustrating an exemplary fabrication method for the semiconductor package shown in FIG. 2.
Figure 7:
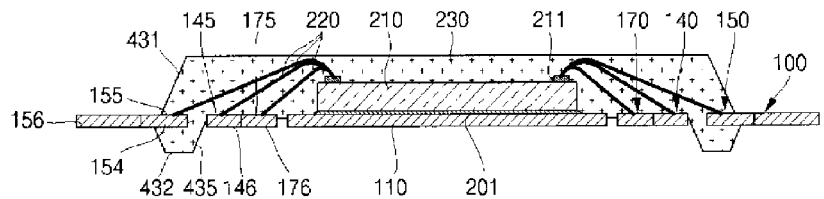
FIGS. 7-9 are views illustrating certain steps of an exemplary fabrication method for the semiconductor package shown in FIG. 2.
Figure 8:
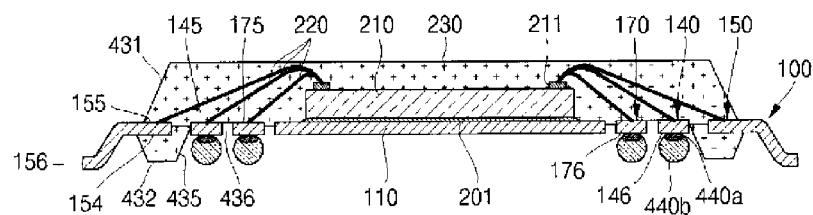
Figure 9:
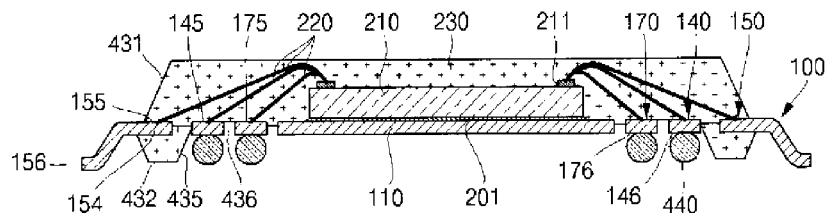

Referring now to FIG. 6, there is provided a flow chart which sets forth an exemplary method for fabricating the semiconductor package 400 of the present invention. The method comprises the steps of preparing the leadframe (S1), semiconductor die attachment (S2), wire bonding (S3), encapsulation (S4), trimming (S5), solder plating (S6), marking (S7), forming and singulation (S8), and solder ball welding (S9). FIGS. 7-9 provide illustrations corresponding to steps S4 and S9, as will be discussed in more detail below. In this regard, steps S1, S2, S3, S5, S6, S7 and S8 of the fabrication method for the semiconductor package 400 are essentially identical to the those same steps as described above in relation to the semiconductor package 200, the only distinction of substance lying in the saw cutting in step S5 for the removal of the land connecting bar 160 in the semiconductor package 400 occurring in the bottom surface of the recess 435 as opposed to the bottom surface 432 of the package body 430.

Referring now to FIG. 7, in the step S4 of the fabrication process for the semiconductor package 400, portions of the leadframe 100, the semiconductor die 210 and the conductive wires 220 are encapsulated with an encapsulant material which, upon hardening, forms the package body 430 of the semiconductor package 400. More particularly, the package body 430 covers the entirety of the semiconductor die 210, the entirety of the conductive wires 220, the entirety of the die pad 110, the entirety of the support bars 161, the entirety of the first leads 170, the entirety of the land connecting bar 160, the entirety of the second leads 140 except for the tie bar portions 147 of those second leads 140 including the same, substantial portions of the tie bars 220, and substantial portions of the inner portions 154 of the third leads 150. However, the package body 230 does not cover the dambar 130, or the outer portions 156 of the third leads 150. Additionally, as indicated above, the package body 230 also does not cover the tie bar portions 147 of those second leads 140 including the same. Though the land connecting bar 160 is covered by the package body 230, the same is singulated or removed from the leadframe 100 by the sawing process described above.

As part of the encapsulation step S4, the initial formation of the package body 430 is followed by the formation of the above-described recess 435 in the bottom surface 432 of the package body 430 as shown in FIG. 7. The recess 435 is formed through the completion of any one of the techniques described above. As previously explained, the recess 435, once formed, facilitates the exposure of the lands 176, 146 and the bottom surface of the die pad 110. As indicated above, the saw cutting in step S5 for the removal of the land connecting bar 160 in the semiconductor package 400 occurs in the bottom surface of the recess 435 as opposed to the bottom surface 432 of the package body 430.

Referring now to FIGS. 8 and 9, in the step S9 of the fabrication process for the semiconductor package 400, the solder balls 440 are electrically connected or welded to respective ones of the lands 176, 146 of the first and second leads 170, 140. As indicated above, each of the lands 176, 146 is exposed in the recess 435 formed in the package body 430 in accordance with step S4 described above. As shown in FIG. 8, step S9 initially comprises coating solder flux 440a onto each of the lands 176, 146. Thereafter, solder material 440b is coated onto the solder flux 440a on each of the lands 176, 146. When a reflow process is performed after sequentially coating the solder flux 440a and the solder material 440b to the lands 176, 146, the volatile solder flux 440a is essentially vaporized, with the solder balls 440 formed from the solder material 440b being welded directly to respective ones of the lands 176, 146. These solder balls 440 reside within the recess 435.

Figure 3:
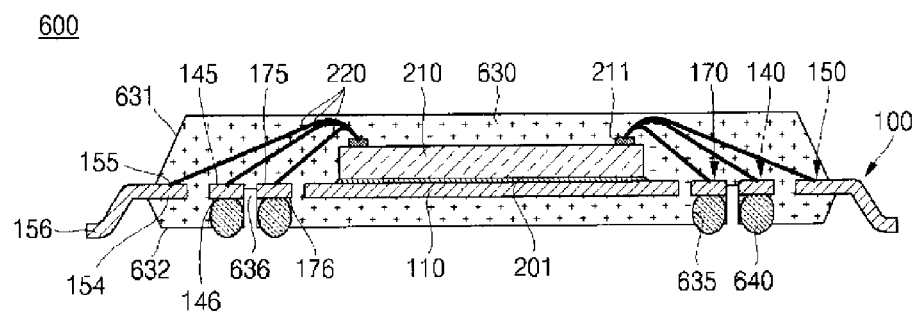
FIG. 3 is a cross-sectional view of a semiconductor package constructed in accordance with a third embodiment of the present invention.

Referring now to FIG. 3, there is shown a semiconductor package 600 constructed in accordance with a third embodiment of the present invention. The semiconductor package 600 is similar in structure to the semiconductor package 200 described above, with only the differences between the semiconductor packages 600, 200 being described below.

The semiconductor package 600 includes the same leadframe 100 described above in relation to the semiconductor package 200. Additionally, the semiconductor package 600 also includes the semiconductor die 210 and the conductive wires 220 which are mechanically and electrically connected to the leadframe 100 in the same manner described above in relation to the semiconductor package 200. Thus, the sole distinction between the semiconductor packages 600, 200 lies in the structural attributes of the package body 630 of the semiconductor package 600 in comparison to the package body 230 of the semiconductor package 200.

More particularly, during the fabrication of the semiconductor package 600, the solder balls 640 (which correspond to the solder balls 240 of the semiconductor package 200) are formed on and electrically connected to respective ones of the lands 176, 146 prior to the formation of the package body 630. As a result, the initially formed package body 430 covers the entirety of the semiconductor die 210, the entirety of the conductive wires 220, the entirety of the die pad 110, the entirety of each of the first leads 170, the entirety of each of the second leads 140 except for the tie bar portions 147 of those second leads 140 including the same, a substantial portion of the inner portion 154 of each of the third leads 150, a substantial portion of each of the tie bars 120, and a substantial portion of each of the solder balls 640. The outer portions 156 of the third leads 150 are not covered by the package body 630, but rather protrude or extend outwardly from respective lateral side surfaces 631 thereof. The dambar 130 is also not covered by the package body 630 so that it may be easily removed or singulated from the leadframe 100. Though the land connecting bar 160 of the unsingulated leadframe 100 is fully covered by the package body 630 upon the initial formation of the same, the land connecting bar 160, in addition to the dambar 130, is ultimately removed from the leadframe 100 in a manner which will be described in more detail below.

The formation of the package body 630 about the solder balls 640 facilitates the formation of openings 635 within the package body 630, each of which has a generally spherical shape. However, each of these openings 635 is completely filled by a respective one of the solder balls 640 by virtue of the molding of the package body 630 about the solder balls 640. Each of the solder balls 640 may be made of any one of the same materials identified above in relation to the solder balls 240 of the semiconductor package 200.

As with the semiconductor package 200, for the semiconductor package 600 to possess the structural attributes shown in FIG. 3, the dambar 130 and the land connecting bar 160 must be removed from the leadframe 100 to facilitate the electrical isolation of the first, second and third leads 170, 140, 150 from each other. Subsequent to the formation of the package body 630, the removal of the land connecting bar 160 is accomplished through the completion of a partial sawing process. This sawing process facilitates the formation of a plurality of elongate grooves 636 within the bottom surface of package body 630, such grooves 436 extending in generally perpendicular relation to each other, and generally perpendicularly between opposed pairs of the side surfaces 631 of the package body 630. It is also contemplated that a conventionally known debarring process may be implemented to remove the dambar 130 during the process of fabricating the semiconductor package 600 due to such dambar 130 not being covered by the fully formed package body 630. The completion of such debarring process results in those second leads 140 including a tie bar portion 147 defining an outer, distal end which is exposed in and substantially flush with a respective side surface 631 defined by the package body 630. Once the dambar 130 has been removed, the exposed outer portions 156 of the third leads 150 of each set thereof which protrude laterally outward from respective side surfaces 631 of the package body 630 may be bent to assume a gull-wing configuration to allow the same to be electrically connected to an underlying substrate such as a printed circuit board. As indicated above, the removal of the land connecting bar 160 is facilitated by sawing with a blade, the grooves 636 being formed as an artifact of such sawing process.

In the completely formed semiconductor package 600, the grooves 636 formed in the package body 630 as a result of the sawing process used to facilitate the removal of the land connecting bar 160 effectively electrically insulate the first and second leads 170, 140 from each other. As seen in FIG. 3, though electrically insulating the first and second leads 170, 140 from each other, end surfaces of such first and second leads 170, 140 are exposed in the grooves 636 subsequent to the completion of the sawing process used to form the same. The semiconductor package 600 provides many of the advantages discussed above in relation to the semiconductor package 200, but also provides the advantage of more simplistic and less costly manufacture attributable to the elimination of those steps described above as needed to facilitate the formation of the openings 235 or the recess 435.

Figure 10:
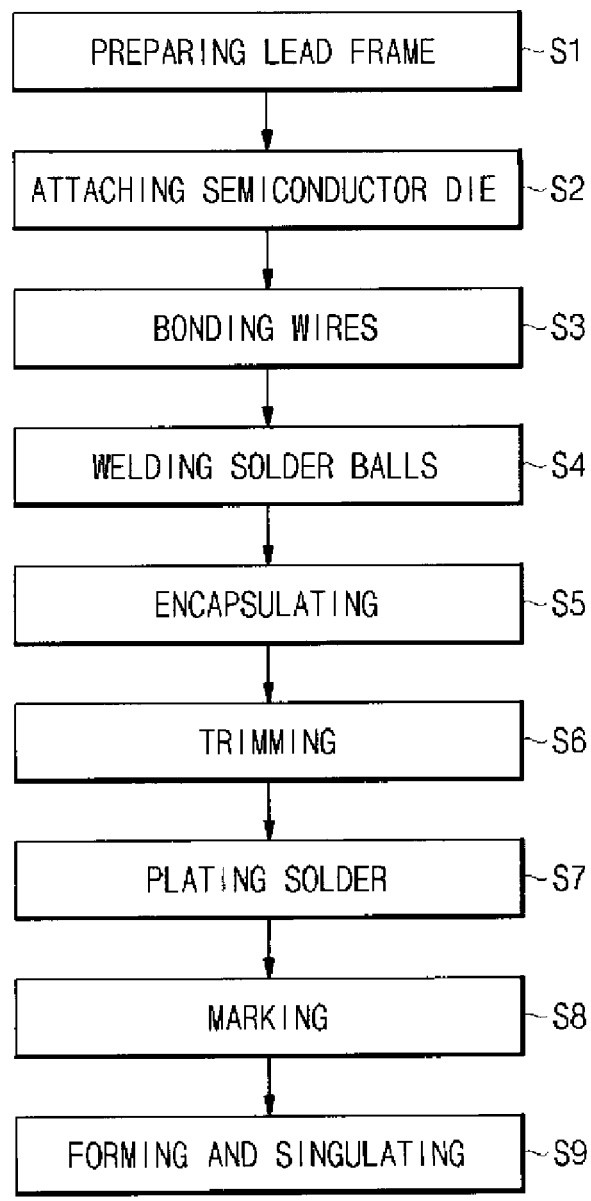
FIG. 10 is a flow chart illustrating an exemplary fabrication method for the semiconductor package shown in FIG. 3.
Figure 11:
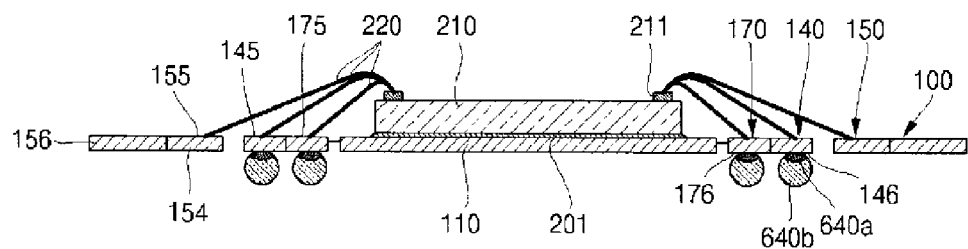
FIGS. 11-12 are views illustrating certain steps of an exemplary fabrication method for the semiconductor package shown in FIG. 3.
Figure 12:
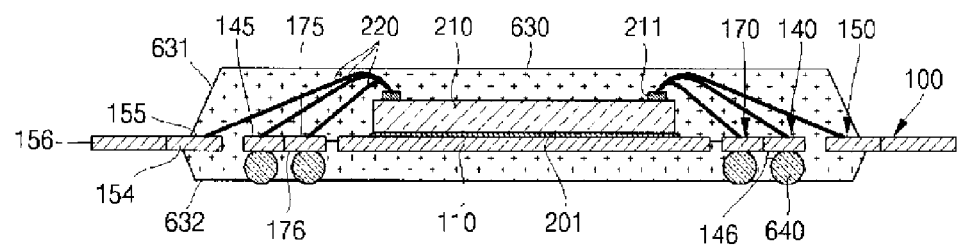

Referring now to FIG. 10, there is provided a flow chart which sets forth an exemplary method for fabricating the semiconductor package 600 of the present invention. The method comprises the steps of preparing the leadframe (S1), semiconductor die attachment (S2), wire bonding (S3), solder ball welding (S4), encapsulation (S5), trimming (S6), solder plating (S7), marking (S8), and forming and singulation (S9). FIGS. 11 and 12 provide illustrations corresponding to steps S4 and S5, as will be discussed in more detail below.

Steps S1-S9 of the manufacturing method for the semiconductor package 600 essentially mirror steps S1-S9 described above in relation to the semiconductor package 200, except for a change in sequence wherein step S9 (welding solder balls) of the method of fabricating the semiconductor package 200 is moved up to step S4 in the method of fabricating the semiconductor package 600. As a result, steps S5-S9 of the method for fabricating the semiconductor package 600 correspond to respective ones of steps S4-S8 for the method of fabricating the semiconductor package 200.

Referring now to FIG. 11, in the step S4 of the fabrication process for the semiconductor package 600, the solder balls 640 are electrically connected or welded to respective ones of the lands 176, 146 of the first and second leads 170, 140. As shown in FIG. 11, step S4 initially comprises coating solder flux 640*a* onto each of the lands 176, 146. Thereafter, solder material 640*b* is coated onto the solder flux 640*a* on each of the lands 176, 146. When a reflow process is performed after sequentially coating the solder flux 640*a* and the solder material 640*b* to the lands 176, 146, the volatile solder flux 640*a* is essentially vaporized, with the solder balls 640 formed from the solder material 640*b* being welded directly to respective ones of the lands 176, 146.

Referring now to FIG. 12, in the step S5 of the fabrication process for the semiconductor package 600, portions of the leadframe 100, the semiconductor die 210, the conductive wires 220 and the solder balls 640 are encapsulated with an encapsulant material which, upon hardening, forms the package body 630 of the semiconductor package 600. More particularly, the package body 430 covers the entirety of the semiconductor die 210, the entirety of the conductive wires 220, the entirety of the die pad 110, the entirety of the support bars 161, the entirety of the first leads 170, the entirety of the land connecting bar 160, the entirety of the second leads 140 except for the tie bar portions 147 of those second leads 140 including the same, substantial portions of the tie bars 220, substantial portions of the inner portions 154 of the third leads 150, and substantial portions of the solder balls 640. However, the package body 630 does not cover the dambar 130, or the outer portions 156 of the third leads 150. Additionally, as indicated above, the package body 630 also does not cover the tie bar portions 147 of those second leads 140 including the same. Though the land connecting bar 160 is covered by the package body 630, the same is singulated or removed from the leadframe 100 by the sawing process described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a generally planar die pad defining multiple peripheral edge segments;
   a plurality of first leads disposed in spaced relation to the die pad, each of the first leads defining a land;
   a plurality of second leads disposed in spaced relation to the die pad, each of the second leads defining a land;
   a plurality of third leads disposed in spaced relation to the die pad;
   a semiconductor die attached to the die pad and electrically connected to at least one of each of the first, second and third leads;
   a package body defining a generally planar bottom surface and multiple side surfaces, the package body at least partially encapsulating the semiconductor die and the first, second and third leads, the package body including a plurality of openings formed in the bottom surface thereof, each of the openings extending to a respective one of the lands of the first and second leads; and
   a plurality of conductive elements disposed within each of the openings, each of the conductive elements being electrically connected to a respective one of the lands and protruding from the bottom surface of the package body, the conductive elements attached to the first leads being separated from corresponding ones of the conductive elements attached to the second leads by at least one groove which is formed in the bottom surface and extends therebetween.

2. The semiconductor package of claim 1 wherein the conductive elements comprise solder balls filled into respective ones of the openings.

3. The semiconductor package of claim 1 wherein the die pad has a generally quadrangular configuration, and the first, second and third leads are segregated into at least four sets which each extend along a respective one of the peripheral edge segments of the die pad.

4. The semiconductor package of claim 1 wherein each of the openings has a tapered configuration so as to be of a first width at the bottom surface of the package body and a second width at a respective one of the lands defined by the first and second leads, the first width exceeding the second width.

5. The semiconductor package of claim 1 wherein the die pad is fully encapsulated by the package body.

6. The semiconductor package of claim 1 wherein the semiconductor die is electrically connected to the first, second and third leads by conductive wires which are covered by the package body.

7. The semiconductor package of claim 6 wherein:
   each of the first leads includes opposed top and bottom surfaces, the bottom surface of each of the first leads defining the land thereof, and the top surface of each of the first leads defining a wire bonding region;

each of the second leads includes opposed top and bottom surfaces, the bottom surface of each of the second leads defining the land thereof, and the top surface of each of the second leads defining a wire bonding region; and
the conductive wires extend from the semiconductor die to respective ones of the wire bonding regions of the first and second leads.

8. The semiconductor package of claim 7 wherein:
each of the third leads includes an inner portion and an outer portion, the inner portion of each of the third leads defining a wire bonding region;
the conductive wires extend from the semiconductor die to respective ones of the wire bonding regions of the third leads; and
the outer portions of the third leads protrude from respective ones of the side surfaces of the package body.

9. The semiconductor package of claim 8 wherein the die pad has a top surface, and the wire bonding regions of the first, second and third leads extend in generally coplanar relation to each other and to the top surface of the die pad.

10. A semiconductor package, comprising:
a generally planar die pad defining multiple peripheral edge segments;
a plurality of first leads disposed in spaced relation to the die pad, each of the first leads defining a land;
a plurality of second leads disposed in spaced relation to the die pad, each of the second leads defining a land;
a plurality of third leads disposed in spaced relation to the die pad;
a semiconductor die attached to the die pad and electrically connected to at least one of each of the first, second and third leads;
a plurality of conductive elements electrically connected to respective ones of the lands defined by the first and second leads; and
a package body defining a generally planar bottom surface and multiple side surfaces, the package body at least partially encapsulating the semiconductor die, the first, second and third leads, and the conductive elements such that the conductive elements protrude from the bottom surface of the package body, and a greater portion of each of the conductive elements is encapsulated by the package body than protrudes from the bottom surface thereof.

11. The semiconductor package of claim 10 wherein the die pad has a generally quadrangular configuration, and the first, second and third leads are segregated into at least four sets which each extend along a respective one of the peripheral edge segments of the die pad.

12. The semiconductor package of claim 10 wherein the semiconductor die is electrically connected to the first, second and third leads by conductive wires which are covered by the package body.

13. The semiconductor package of claim 12 wherein:
each of the first leads includes opposed top and bottom surfaces, the bottom surface of each of the first leads defining the land thereof, and the top surface of each of the first leads defining a wire bonding region;
each of the second leads includes opposed top and bottom surfaces, the bottom surface of each of the second leads defining the land thereof, and the top surface of each of the second leads defining a wire bonding region; and
the conductive wires extend from the semiconductor die to respective ones of the wire bonding regions of the first and second leads.

14. The semiconductor package of claim 13 wherein:
each of the third leads includes an inner portion and an outer portion, the inner portion of each of the third leads defining a wire bonding region;
the conductive wires extend from the semiconductor die to respective ones of the wire bonding regions of the third leads; and
the outer portions of the third leads protrude from respective ones of the side surfaces of the package body.

15. The semiconductor package of claim 14 wherein the die pad has a top surface, and the wire bonding regions of the first, second and third leads extend in generally coplanar relation to each other and to the top surface of the die pad.

16. A semiconductor package, comprising:
a generally planar die pad defining opposed top and bottom surfaces and multiple peripheral edge segments;
a plurality of first leads disposed in spaced relation to the die pad, each of the first leads defining a land and a wire bonding region which extends in generally coplanar relation to the top surface of the die pad;
a plurality of second leads disposed in spaced relation to the die pad, each of the second leads defining a land and a wire bonding region which extends in generally coplanar relation to the top surface of the die pad;
a plurality of third leads disposed in spaced relation to the die pad, each of the third leads defining a wire bonding region which extends in generally coplanar relation to the top surface of the die pad;
a semiconductor die attached to the top surface of the die pad and electrically connected to the wire bonding region of at least one of each of the first, second and third leads; and
a package body at least partially encapsulating the semiconductor die and the first, second and third leads, the package body including a single recess formed in a generally planar bottom surface defined thereby, each of the lands of the first and second leads and the bottom surface of the die pad being at least partially exposed within the recess.

17. The semiconductor package of claim 16 further comprising a plurality of conductive elements disposed within the recess and electrically connected to respective ones of the lands defined by the first and second leads.

18. The semiconductor package of claim 16 wherein the die pad has a generally quadrangular configuration, and the first, second and third leads are segregated into at least four sets which each extend along a respective one of the peripheral edge segments of the die pad.

19. The semiconductor package of claim 16 wherein:
the semiconductor die is electrically connected to the first, second and third leads by conductive wires which are covered by the package body
each of the first leads includes opposed top and bottom surfaces, the bottom surface of each of the first leads defining the land thereof, and the top surface of each of the first leads defining the wire bonding region thereof;
each of the second leads includes opposed top and bottom surfaces, the bottom surface of each of the second leads defining the land thereof, and the top surface of each of the second leads defining the wire bonding region thereof; and
the conductive wires extend from the semiconductor die to respective ones of the wire bonding regions of the first and second leads.

20. The semiconductor package of claim 19 wherein:
each of the third leads includes an inner portion and an outer portion, the inner portion of each of the third leads defining the wire bonding region thereof;
the conductive wires extend from the semiconductor die to respective ones of the wire bonding regions of the third leads; and
the outer portions of the third leads protrude from respective ones of multiple side surfaces defined by the package body.

\* \* \* \* \*